United States Patent
Wu et al.

(10) Patent No.: US 12,506,015 B2
(45) Date of Patent: Dec. 23, 2025

(54) SEMICONDUCTOR WAFER THINNED BY HORIZONTAL STEALTH LASING

(71) Applicant: Sandisk Technologies, Inc., Milpitas, CA (US)

(72) Inventors: Yi Wu, Shanghai (CN); Junrong Yan, Shanghai (CN); Zhonghua Qian, Shanghai (CN); Keming Zhou, Shanghai (CN); Kailei Zhang, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 408 days.

(21) Appl. No.: 17/841,357

(22) Filed: Jun. 15, 2022

(65) Prior Publication Data
US 2023/0411169 A1    Dec. 21, 2023

(51) Int. Cl.
*H01L 21/463* (2006.01)
*H01L 21/687* (2006.01)

(52) U.S. Cl.
CPC ...... *H01L 21/463* (2013.01); *H01L 21/68764* (2013.01)

(58) Field of Classification Search
None
See application file for complete search history.

(56) References Cited

U.S. PATENT DOCUMENTS

| | | | |
|---|---|---|---|
| 10,319,593 B2 | 6/2019 | Hirata et al. | |
| 10,388,526 B1* | 8/2019 | Seddon | H01L 21/304 |
| 2004/0113283 A1 | 6/2004 | Farnworth et al. | |
| 2014/0225279 A1 | 8/2014 | Choi et al. | |
| 2015/0170967 A1 | 6/2015 | Yang | |
| 2016/0071770 A1* | 3/2016 | Albermann | H01L 21/02076 257/797 |
| 2017/0306524 A1* | 10/2017 | Bennett | C30B 33/06 |
| 2018/0190621 A1* | 7/2018 | Yan | H01L 24/48 |

(Continued)

FOREIGN PATENT DOCUMENTS

| | | |
|---|---|---|
| JP | 2018160623 A | 10/2018 |
| JP | 2020069532 | 5/2020 |

(Continued)

OTHER PUBLICATIONS

Notice of Allowance and Fee(s) Due dated Nov. 8, 2023 in U.S. Appl. No. 18/128,622.

(Continued)

*Primary Examiner* — Cory W Eskridge
(74) *Attorney, Agent, or Firm* — Pearl Cohen Zedek Latzer Baratz LLP

(57) ABSTRACT

A method includes the step of thinning a semiconductor wafer by a horizontal stealth lasing process, and semiconductor wafers, dies and devices formed thereby. After formation of an integrated circuit layer on a semiconductor wafer, the wafer may be thinned by supporting an active surface of the wafer on a rotating chuck, and focusing a horizontally-oriented laser in multiple cycles at different radii within the rotating wafer. Upon completion of the multiple cycles, a portion of the wafer substrate may be removed, leaving the wafer thinned to its final thickness. Thereafter, a vertical stealth lasing process may be performed to cut individual semicondcutor dies from the thinned wafer.

11 Claims, 10 Drawing Sheets

(56) References Cited

U.S. PATENT DOCUMENTS

| | | |
|---|---|---|
| 2021/0193453 A1 | 6/2021 | Wu et al. |
| 2021/0202316 A1 | 7/2021 | Upadhyayula et al. |
| 2021/0210387 A1 | 7/2021 | Fujii et al. |
| 2021/0316476 A1* | 10/2021 | Nomaru ............. B23K 26/0622 |
| 2022/0009039 A1* | 1/2022 | Korematsu ........ B23K 26/0823 |
| 2022/0020705 A1* | 1/2022 | Loh .................... H01L 21/6836 |

FOREIGN PATENT DOCUMENTS

| | | |
|---|---|---|
| JP | 2021180301 | 11/2021 |
| KR | 20210081403 A | 7/2021 |

OTHER PUBLICATIONS

Final Office Action dated Apr. 27, 2023 in U.S. Appl. No. 16/933,177.
Office Action dated Jan. 28, 2022 in U.S. Appl. No. 16/933,177.
Response to Office Action dated Apr. 22, 2022 in U.S. Appl. No. 16/933,177.
Final Office Action dated Aug. 5, 2022 in U.S. Appl. No. 16/933,177.
Response to Final Office Action dated Nov. 1, 2022 in U.S. Appl. No. 16/933,177.
Office Action dated Nov. 25, 2022 in U.S. Appl. No. 16/933,177.
Response to Office Action dated Feb. 27, 2023 in U.S. Appl. No. 16/933,177.

* cited by examiner

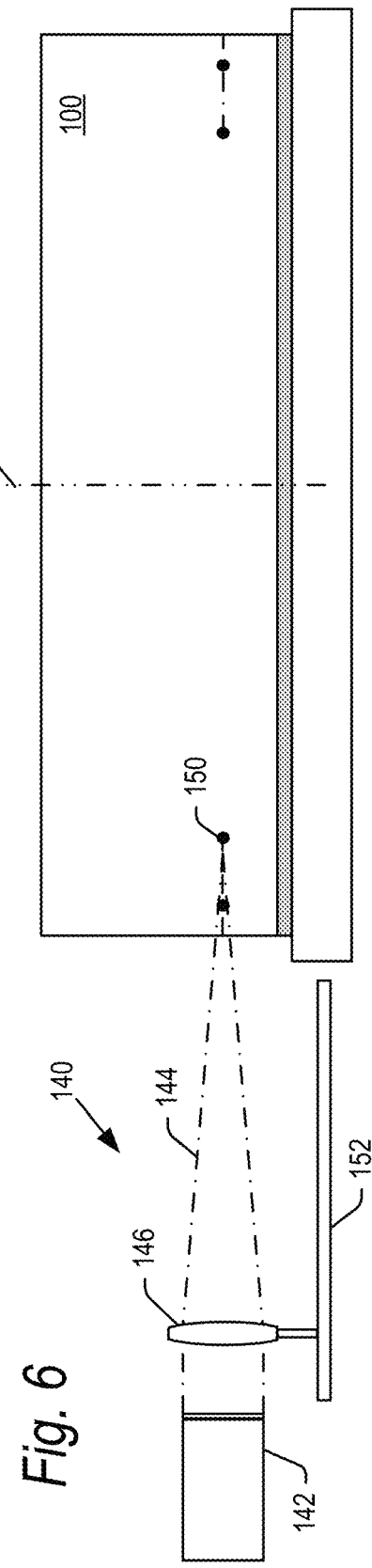
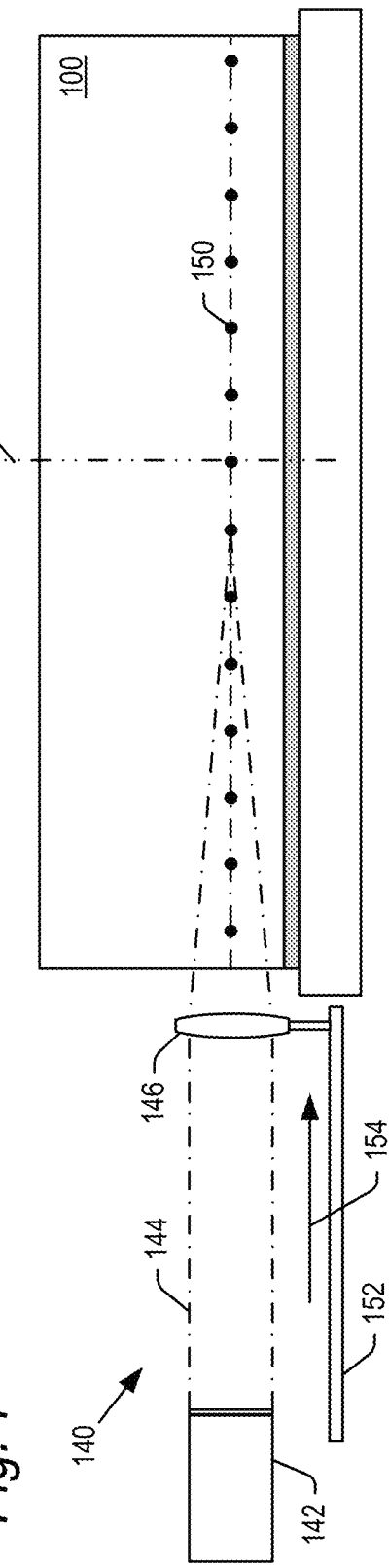

SEMICONDUCTOR WAFER THINNED BY HORIZONTAL STEALTH LASING

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic products, including for example digital cameras, digital music players, video game consoles, computer SSDs, PDAs and cellular telephones.

Wafers are currently shipped from the wafer fab with a typical thickness of 760 microns to prevent damage during transport, and then thinned once the individual semiconductor dies are defined within the wafer. In order to maximize storage capacity for a given form factor storage device, semiconductor dies, and the wafers from which they are made, are being fabricated to ever-decreasing thicknesses. Currently, wafers are being thinned for example to 36 microns, 25 microns and thinner.

A popular method of thinning semiconductor wafers involves a backgrinding process where the back, inactive surface of the wafer is thinned using a number of grinding wheels while the front, active surface of the wafer is covered by protective tape and supported on a chuck. Conventional backgrinding processes have several disadvantages, including non-uniform thicknesses across the wafer surface. Backgrinding can also exert forces on the wafer that may generate cracks, especially given the current fragile thicknesses of semiconductor wafers. Cracked dies have to be discarded, thus reducing yield. Moreover, detection of cracks also requires an additional screening/inspection step, adding to fabrication costs and processing time. Conventional backgrinding processes further generate debris and foreign materials that can also cause cracks and otherwise impair the fabrication of the dies on the wafers.

DESCRIPTION OF THE DRAWINGS

FIGS. 6 and 7 are cross-sectional side views showing the horizontal stealth lasing process for thinning a semiconductor wafer at two different points in the process according to embodiments of the present technology.

DETAILED DESCRIPTION

Figure 1:
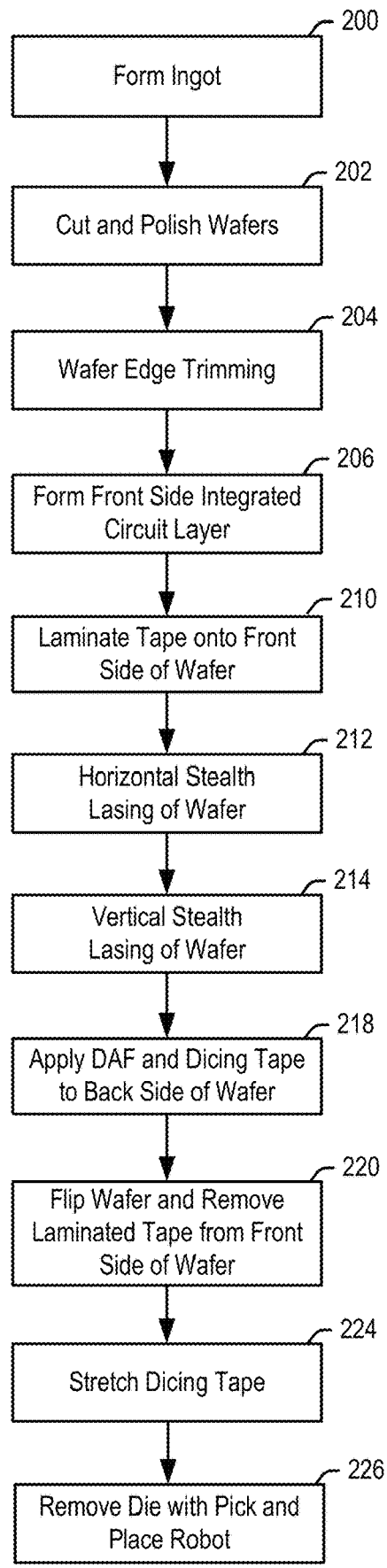
FIG. 1 is a flowchart for forming a semiconductor wafer and semiconductor dies according to embodiments of the present technology.

The present technology will now be described with reference to the figures, which in general, relate to a method of thinning a semiconductor wafer by a horizontal stealth lasing process, and semiconductor wafers, dies and devices formed thereby. After formation of an integrated circuit layer on a semiconductor wafer, the wafer may be thinned by supporting an active surface of the wafer on a rotating chuck, and focusing a horizontally-oriented laser through an outer edge of the wafer in multiple cycles at different radii within the rotating wafer. Upon completion of the multiple cycles, a portion of the wafer substrate may be removed, leaving the wafer thinned to its final thickness. Thereafter, a vertical stealth lasing process may be performed to dice individual semicondcutor dies from the thinned wafer.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal" as may be used herein are by way of example and illustrative purposes only, and are not meant to limit the description of the technology inasmuch as the referenced item can be exchanged in position and orientation. Also, as used herein, the terms "substantially," "approximately" and/or "about" mean that the specified dimension or parameter may be varied within an acceptable manufacturing tolerance for a given application. In one embodiment, the acceptable manufacturing tolerance is 0.15 mm or alternatively ±2.5% of a given dimension.

For purposes of this disclosure, a connection may be a direct connection or an indirect connection (e.g., via one or more other parts). In some cases, when a first element is referred to as being connected, affixed, mounted or coupled to a second element, the first and second elements may be directly connected, affixed, mounted or coupled to each other or indirectly connected, affixed, mounted or coupled to each other. When a first element is referred to as being directly connected, affixed, mounted or coupled to a second element, then there are no intervening elements between the first and second elements (other than possibly an adhesive or melted metal used to connect, affix, mount or couple the first and second elements).

An embodiment of the present technology will now be explained with reference to the flowchart of FIG. 1, and the views of FIGS. 2-14. Referring initially to the flowchart of FIG. 1, a semiconductor wafer 100 may start as an ingot of wafer material, which may be formed in step 200. In one example, the ingot from which the wafers 100 are formed may be monocrystalline silicon grown according to either a Czochralski (CZ) or floating zone (FZ) process. However, wafer 100 may be formed of other materials and by other processes in further embodiments.

In step 202, the semiconductor wafer 100 may be cut from an ingot and polished on both the first major surface 102 (FIG. 2), and second major surface 104 (FIG. 3) opposite surface 102, to provide smooth surfaces. In step 204, the wafer may be trimmed along an outer circumference to ensure edges of the wafer 100 at the outer circumference are vertical (parallel to a central axis of rotation of the wafer). These vertical edges prevent refraction of the laser through outer circumference edge as explained below.

Figure 2:
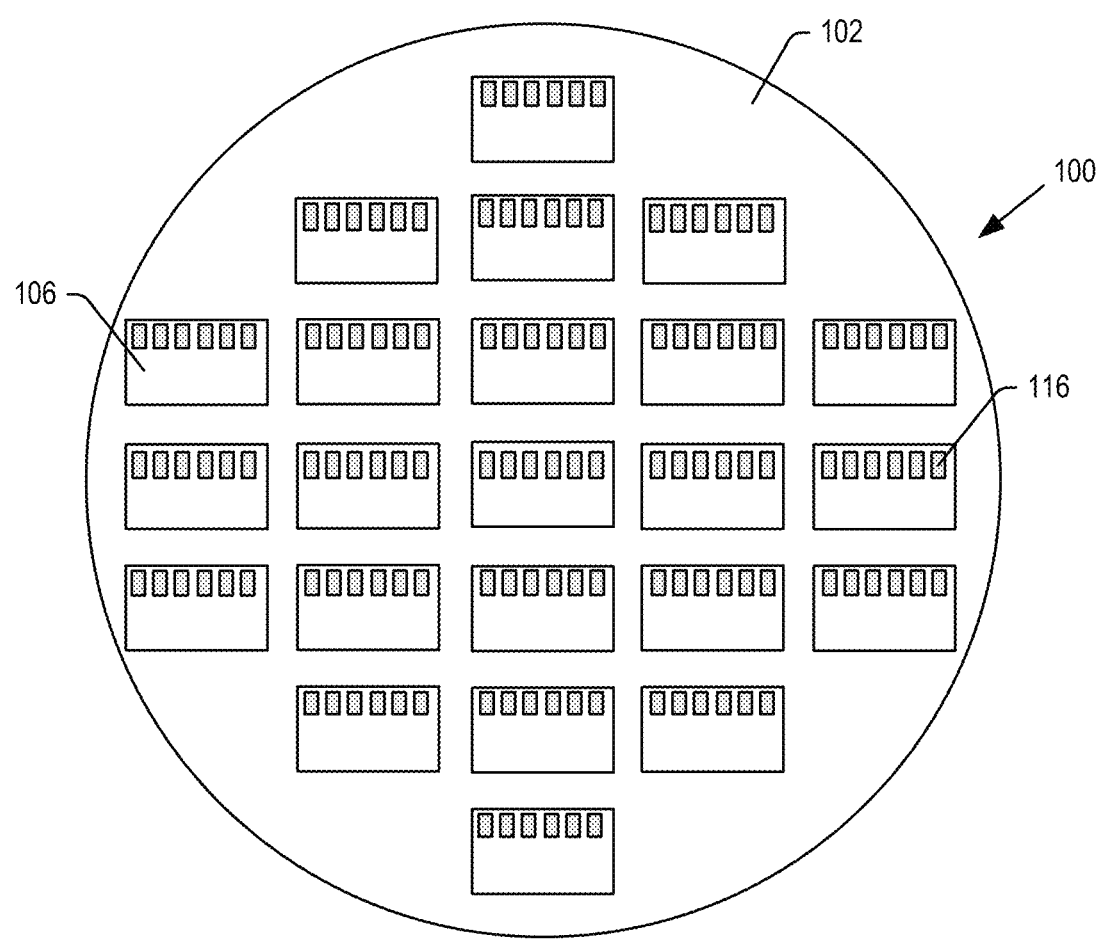
FIG. 2 is a front view of a semiconductor wafer showing a first major surface of the wafer.
Figure 3:
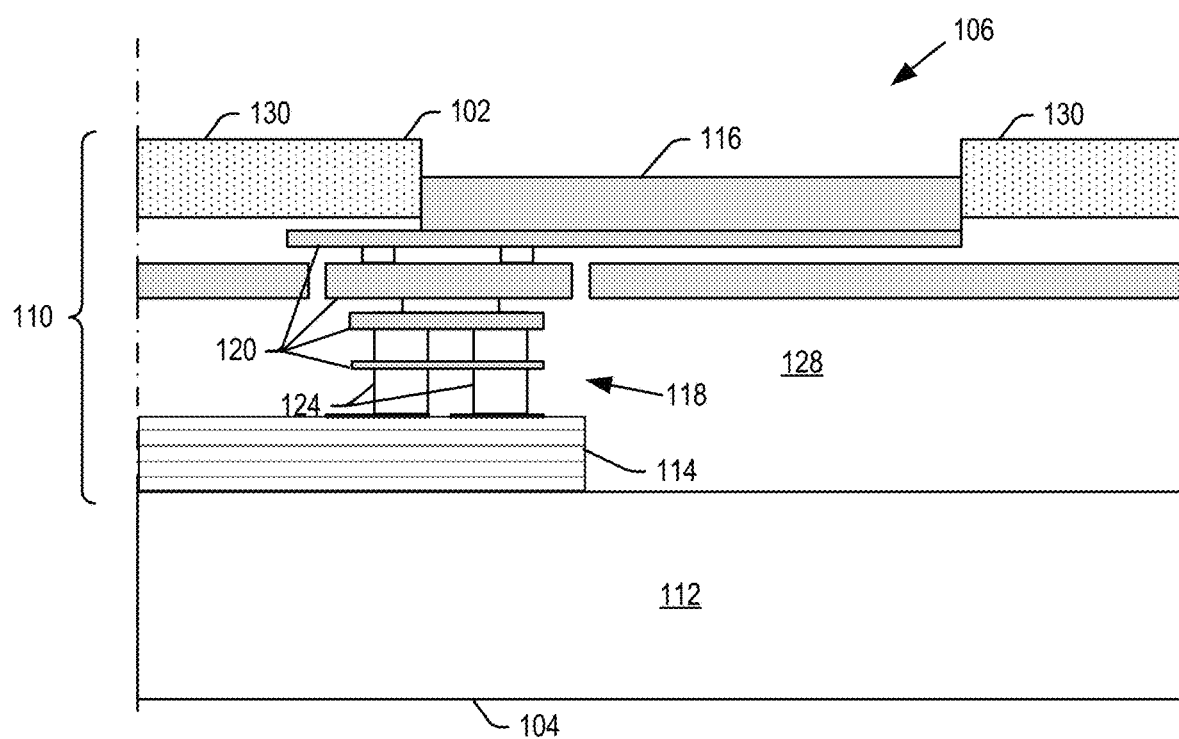
FIG. 3 is an enlarged cross-sectional edge view showing the circuit layer formed over a substrate within a semiconductor die.
Figure 4:
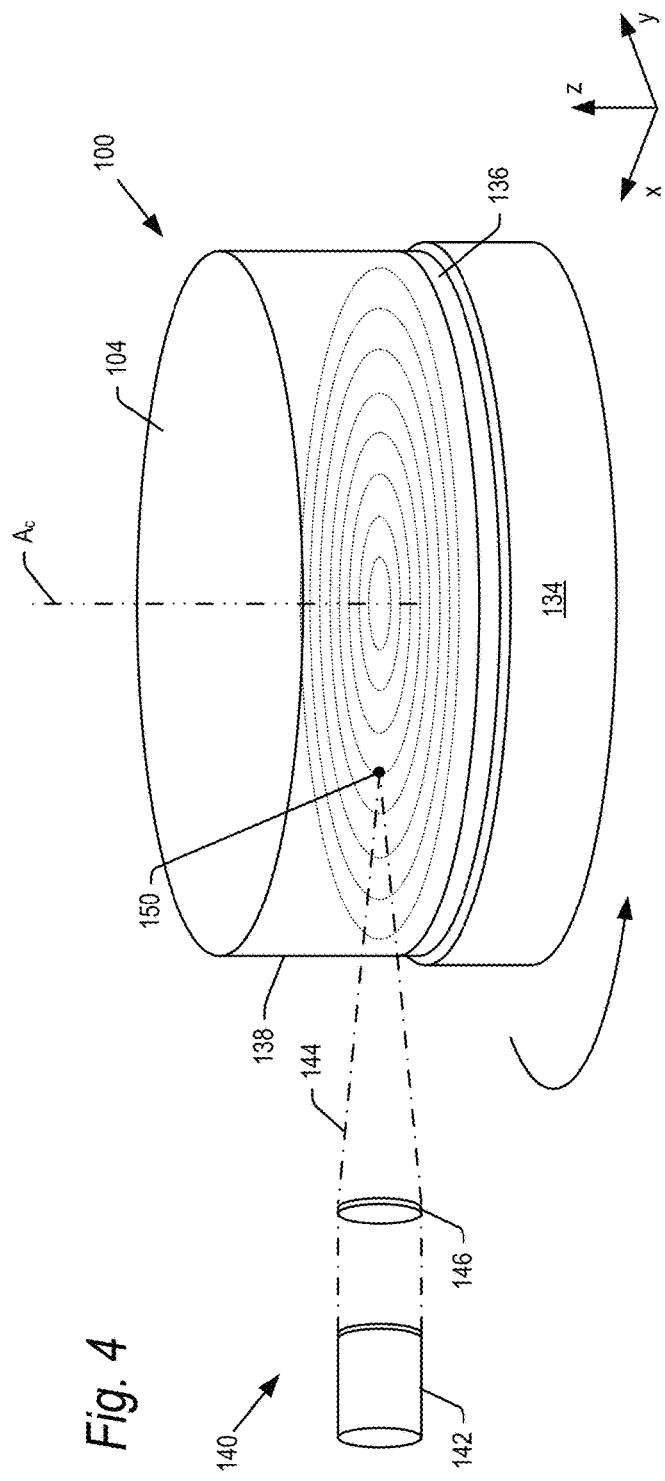
FIG. 4 is a perspective view of a horizontal stealth lasing process for thinning a semiconductor wafer according to embodiments of the present technology.

In step 206, the first major surface 102 may undergo various processing steps to divide the wafer 100 into respective semiconductor dies 106 (one of which is numbered in FIGS. 2 and 3), and to form integrated circuits of the respective semiconductor dies 106 in active areas of the dies on and/or in the first major surface 102. These various processing steps may include photolithographic steps, etching steps and metallization steps depositing metal layers, vias and contacts for transferring signals to and from the integrated circuits. FIG. 3 is a cross-sectional side view of an exemplary semiconductor die 106 of the wafer 100 showing the integrated circuit layer 110 formed in a silicon substrate region 112. Integrated circuit layer 110 may in general include integrated circuits 114 electrically coupled to surface die bond pads 116 by metallization layers 118. The integrated circuits 114 may be formed by various processes including for example deposition, patterning and doping of metals, metal oxides and silicon.

After formation of the integrated circuits 114, metallization layers 118 may be defined including metal interconnects 120 and vias 124 layered sequentially in a dielectric film 128. As is known in the art, the metal interconnects 120, vias 124 and dielectric film 128 may be formed for example by damascene processes a layer at a time using photolithography and thin-film deposition. The metal interconnects 120 and vias 124 may be used to form conductive nodes for transferring signals and voltages between the die bond pads 116 and integrated circuits 114. A passivation layer 130 may be formed on top of the upper dielectric film layer 128. The passivation layer 130 may be etched to expose the die bond pads 116.

In embodiments, the semiconductor dies 106 may for example be flash memory dies such as 2D NAND flash memory or 3D BiCS (Bit Cost Scaling), V-NAND or other 3D flash memory, but other types of dies 106 may be used. These other types of semiconductor dies include but are not limited to RAM, a controller, an SOC (system on a chip), a processor or other types of semiconductor dies. The number of dies 106 shown on wafer 100 in FIG. 2 is for illustrative purposes, and wafer 100 may include more semiconductor dies 106 than are shown in further embodiments. Similarly, the number of bond pads 116 on each semiconductor die 106 is shown for illustrative purposes, and each die 106 may include more die bond pads than are shown in further embodiments.

After formation of the integrated circuit layer 110 in step 206, a layer of tape may be laminated onto the active, first major surface 102 in step 210. The wafer 100 may then be turned over and thinned in step 212. In accordance with aspects of the present technology, the wafer 100 may be thinned by performing a horizontal stealth lasing step as will now be explained with reference to FIGS. 4-12. Referring to the perspective view of FIG. 4, the wafer 100 may be supported on a chuck 134 or other support surface with the layer of tape 136 separating the active surface 102 from the chuck 134. The second major surface 104 faces upward. In embodiments, the chuck 134 is configured to rotate about a central axis $A_c$. The wafer 100 is centered on the chuck 134 so that the wafer is also concentric about the central axis $A_c$.

A laser assembly 140 is provided to emit a pulsed laser beam though the circumferencial outer edge 138 of the wafer into the depth of the wafer 100, specifically into the silicon substrate region 112. The laser assembly 140 may include a laser generator 142 for generating a laser beam 144, and optics 146 for focusing the laser beam 144 to a point within the interior of the wafer 100 as explained below. The laser generator may generate an infrared or near-infrared laser, at a wavelength of for example 1342 nm. Other wavelengths lasers are contemplated. The peak power of laser generator 142 and beam area together define the peak power density of laser beam 144:

Peak power density $W/m^2$=peak power (W)/beam area ($m^2$).

In one example, the peak power of laser generator 142 may be 2 W, and the beam diameter 2-4 μm. These values are by way of example only, and may vary in further embodiments. In one example, the laser generator may pulse the laser beam 144 at 90 KHz.

The optics 146 may for example include a colimating lens capable of focusing the parallel wavelengths of light from laser generator 142 to a focal point of maximum energy. The laser assembly 140 is shown schematically, and may include additional components for generating and focusing the laser, including a contoller for controlling the intensity and pulse frequency of the laser.

The laser assembly 140 is configured to emit a horizontal beam in the x-y plane (when the central axis $A_c$ is vertical along the z-axis) though the outer circumferencial edge 138 of wafer 100. It is possible that the laser beam 144 not be horizontal in further embodiments, with the provision that the laser beam 144 be emitted in a plane that is orthogonal to the central axis $A_c$. In accordance with the present technology, the laser assembly 140 is positioned along the vertical z-axis to emit the beam 144 into the silicon substrate region 112 in a plane equating to the final thickness of the wafer 100. In embodiments, this final thickness may be between 20 μm to 100 μm, including 25 μm and 36 μm, but it is understood that the laser assembly 140 may be positioned to achieve other final thicknesses of wafer 100 within this range or outside of this range.

Once the vertical height of the laser assembly 140 is set, the opticics 146 focus the laser beam 144 at a first, pre-defined radius (as explained below) for example adjacent the central axis of rotation $A_c$ of the wafer 100. The wafer 100 is then rotated on chuck 134 through a full cycle (360°) while laser emits pulses of light at the predefined frequency.

After completion of the first cycle, the radius at which the laser focuses is then adjusted to a new radius, and the wafer is again rotated through a full cycle while the laser emits pulses of light at the predefined frequency. This process may continue in multiple cycles through increasing radii until the laser is focused at or near the outer edge 138 of the wafer 100.

Figure 5:
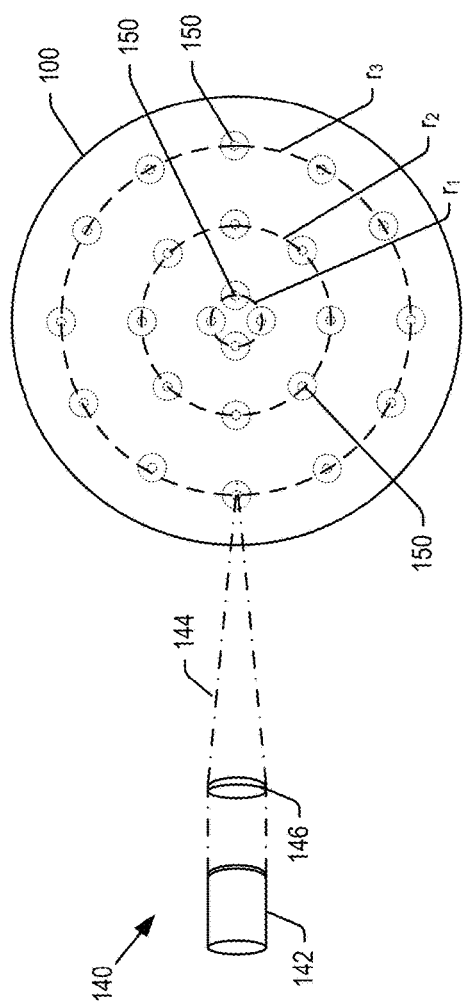
FIG. 5 is a cross-sectional top view of a wafer being thinned by a horizontal stealth lasing process according to embodiments of the present technology.

Referring to FIG. 5, there is shown a cross-sectional top view of wafer 100. In the illustrated example, the laser assembly 140 has been focused at three different radii, $r_1$, $r_2$ and $r_3$. The laser assembly has emitted pulses at each radius with a predefined frequency as the wafer 100 rotates on chuck 134. When the laser beam hits a peak power density during a pulse at the focal point, the wafer absorbs the energy, and a localized pinpoint hole 150 is created beneath the wafer's surface in the horizontal plane of the laser beam at the radii, $r_1$, $r_2$ and $r_3$. Multiple pinpoint holes 150 are created at each radius. In one example, a pinpoint hole 150 may be created around a given radius once every 5 μm to 10 μm, though the pinpoint holes 150 may be spaced closer to each other or farther from each other than that range in further embodiments. FIG. 5 shows a simplified example for illustrative purposes and there many be many more radii at which the laser cycles are performed. For example, for a 300 mm wafer, there may be 250 different cycles, each performed at equally spaced radii.

In one embodiment, the pulse rate of the laser generator 140 is constant. Given that the circumference arclength at a radius near a center of the wafer has a smaller length and fewer pinpoint holes than the circumference arclength at an outer radius, the angular velocity of the chuck 134 may vary so that the number of pinpoint holes per unit length at a given radius remains constant. In one example, the rotating chuck maintains a constant linear velocity of about 700 mm per second. Thus, the angular velocity of the chuck will vary by:

$$\omega = v/r,$$

$$\omega = 700 \text{ mm}/r,$$

where ω is angular velocity, v is linear velocity and r is the radius. It is understood that the linear velocity may be higher or lower than this in further embodiments. In further embodiments, the angular velocity of the rotating chuck may be held constant, and the predefined pulse frequency of the laser generator 142 may vary, depending the radial distance from the central axis of rotation.

FIGS. 6 and 7 are side views illustrating how the optics 146 may control the focal point of laser assembly 140 at different radii of a given plane within the wafer 100. The optics 146 may be mounted for translation on a fixture 152. As one example, the optics 146 may be mounted to a pinion gear driven to rotate by a motor along a stationary rack inside the fixture. Other drive systems are contemplated for translating the optics within fixture 152 in further embodiments.

The optics 146 may focus the laser to a point at some predefined distance in front of the optics 146. When the optics are positioned near to the laser generator (FIG. 6), the laser beam 144 will focus at a radius near the outer circumference of the wafer 100. Once a cycle at a given radius is completed, the optics may translate along fixture 152 in the direction of arrow 154 to a new radius where the laser beam 144 is focused and a new cycle begins. The laser generator 142 continues to generate pinpoint holes 150 at different radii, until the optics 146 focus the laser beam 144 at or near the central axis $A_c$ of the wafer 100. In further embodiments, the laser may start at or near the central axis $A_c$, and work outward, with the optics translating on fixture 152 in a direction opposite arrow 154. The laser assembly 140 and fixture 152 are shown schematically in FIGS. 6 and 7 and both may vary in their composition in further embodiments.

Thinning the wafer 100 in accordance with aspects of the present technology provides several advantages, including a reduction in wafer fabrication times. For example, the time it takes to thin a single wafer may be calculated by the total circumferencial arclength spanned by the laser over the various radii divided by the linear speed of the rotating chuck. The total circumferencial length spanned by the laser over all radii is given by:

$$CL_{tot} = CL_1 + CL_2 + CL_3 + \ldots + CL_n,$$

where $CL_1$ is the arclength of the circumference at the first radius, $CL_2$ is the arclength of the circumference at the second radius, etc., and n is the total number of cycles (e.g., 250). As the arclength of a circumference is equal to $2\pi r$:

$$CL_{tot} = 2\pi(r_1 + r_2 + r_3 + \ldots r_n).$$

With radii be equally spaced, the total radial distance can be summed as the total number of cycles multiplied by the first radius plus the last radius divided by 2:

$$(r_1 + r_2 + r_3 + \ldots r_n) = 250(r_1 + r_n)/2.$$

Taking an example where the first radius is 0.6 mm from the central radius Ac, and the last radius is at 150 mm from the central radius, the total circumferencial arclength distance travelled by the laser is:

$$CL_{tot} = 2\pi * 250(0.6 \text{ mm} + 150 \text{ mm})/2$$

$$CL_{tot} = 118,221 \text{ mm}$$

For a linear rotational speed of the chuck 134 of 700 mm/second, the total time to thin a wafer in accordance with the present technology is:

$$T_{tot} = CL_{tot}/V_{chuck}$$

$$T_{tot} = 118,221 \text{ mm}/700 \text{ mm/s} = 169 \text{ seconds}.$$

By comparison, conventional wafer thinning by backgrind takes between 500 to 600 seconds per wafer. Thus, the present technology improves wafer thinning times by about 300% to 360%.

Figure 8:
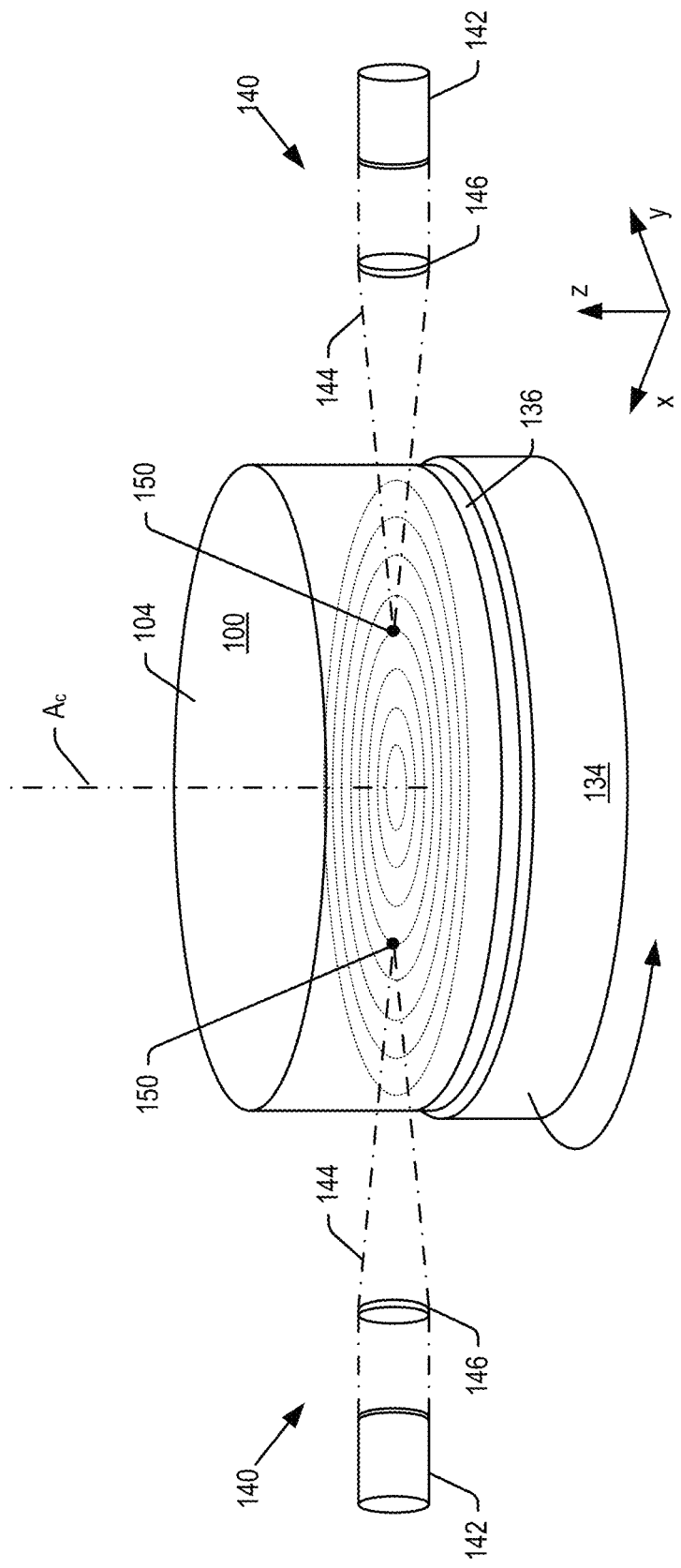
FIG. 8 is a perspective view of a horizontal stealth lasing process for thinning a semiconductor wafer according to alternative embodiments of the present technology.
Figure 9:
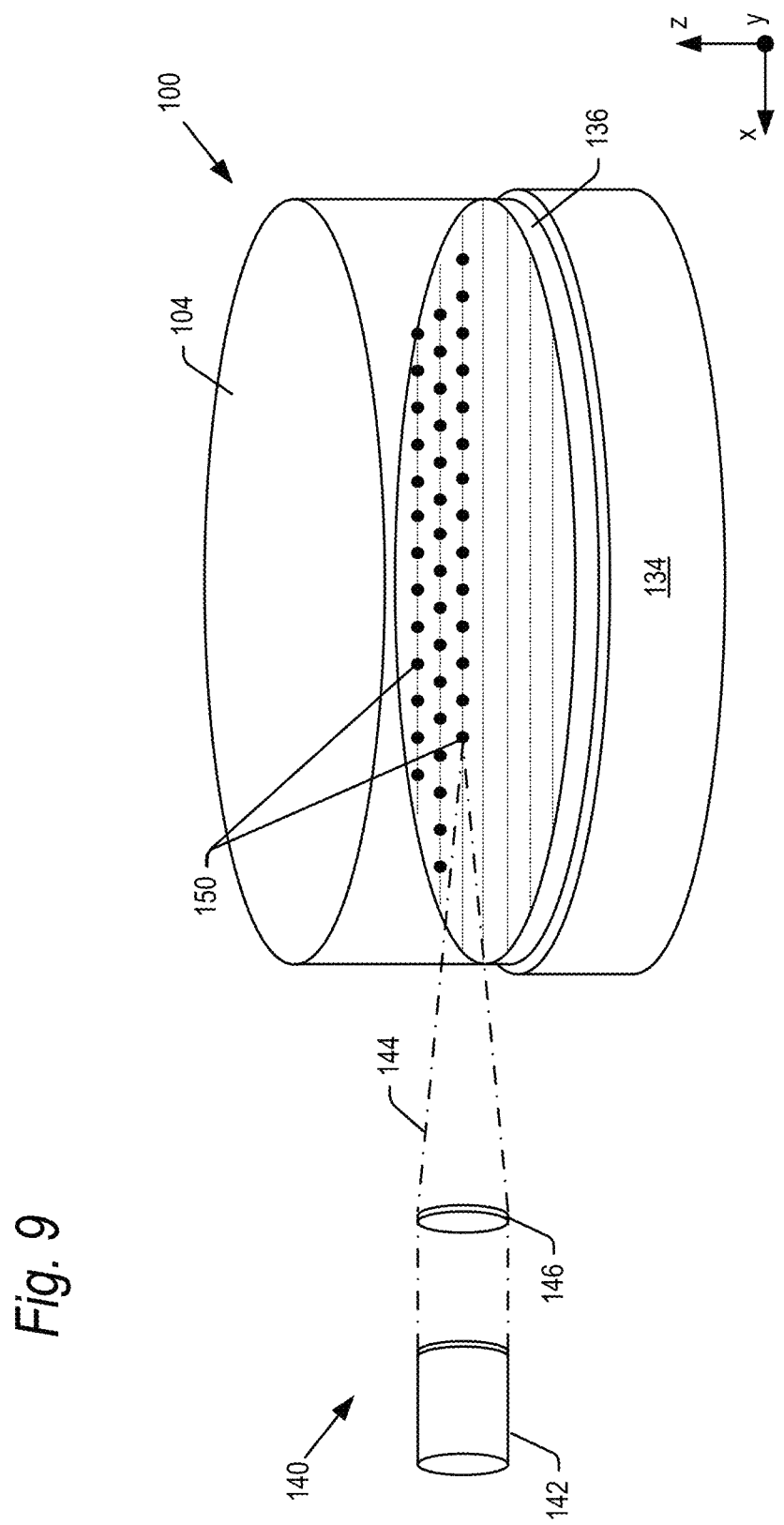
FIG. 9 is a perspective view of a horizontal stealth lasing process for thinning a semiconductor wafer according to a further alternative embodiment of the present technology.

The speed of the wafer thinning operation in accordance with the present technology may be further reduced by adding additional laser assemblies. FIG. 8 is a perspective view of a wafer being thinned by a pair of laser assemblies 140. Each laser assembly 140 may be structurally and operationally the same as each other and as described above. The two laser assemblies 140 may be mounted to direct their respective beams 144 into the wafer 100 in the same horizontal plane (perpendicular to the central axis $A_c$). The laser assemblies may be spaced from each other 180°, though they need not be in further embodiments.

In one embodiment, the optics 146 of both laser assemblies 140 may be controlled to focus their lasers beams 144 at the same radius from the central axis Ac. Thus, a complete cycle of pinpoint holes 150 may be made around an entire circumference at a given radius upon rotation through 180°. The result is that the time to thin the wafer may be further reduced by one-half. In a further embodiment, the respective lasers may focus at different radii, thus requiring 360° for a full cycle, but reducing the number of cycles by one-half, thus again halving the overall time to to thin the wafer. It is possible that the wafer thinning set-up include three, four or more laser assemblies 140 to further reduce the wafer thinning processing time.

In embodiments described herein, the horizontal stealth lasing process is accomplished by forming localized pinpoint holes 150 at different radii as the wafer 100 is spinning. However, in a further embodiment shown in FIG. 9, the localized pinpoint holes 150 may be formed in rows along straight lines through the wafer while the wafer is stationary (not spinning) In this embodiment, the laser is mounted on a fixture configured to move the laser generator along the y-axis (into and out of the page of FIG. 9), and configured to move the optics 146 along the x-axis so that multiple rows of pinpoint holes 150 are formed. In this embodiment, the optics 146 is configured to travel the full diameter of the wafer 100 (whereas the optics 146 in the embodiment of FIG. 4 need only travel the radial distance of wafer 100). In a further example, the embodiment of FIG. 9 may be fit with a second laser assembly 140 (as in FIG. 8). In such an embodiment, each laser may form pinpoint holes 150 along straight line rows across one-half the wafer. Thus, the laser assembly 140 to the left of the wafer 100 forms the pinpoint holes 150 on the left side of the wafer, and the laser assembly 140 to the right of the wafer 100 forms the pinpoint holes 150 on the right side of the wafer.

Figure 10:
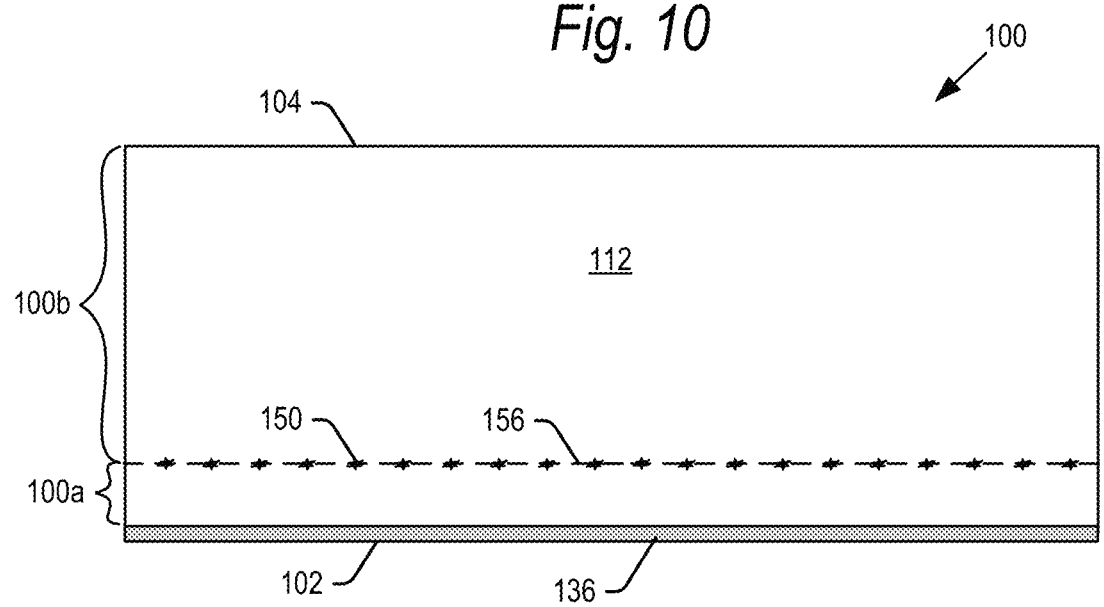
FIG. 10 is an edge view of a wafer after a stealth lasing process according to embodiments of the present technology.

FIG. 10 is a side view of wafer 100 after completion of all cycles of the stealth horizontal lasing process of step 212. Once the cycles of pinpoint holes 150 have been completed at each of the radii, cracks will naturally propagate between the holes in the [1,1,0] crystalline plane (in the x, y plane of FIG. 4), thus effectively severing a first portion 100a from a second portion 100b at an x-y plane 156. This first portion 100a is the portion of the wafer including the active surface having the integrated circuits, and is the final thickness wafer 100. The second portion is a portion of the silicon substrate region 112, which may be discarded. In one example, before the horizontal lasing portion of the present technology, the wafer may have a total thickness of 760 μm. In one example, the final thickness of the first portion 100a of wafer 100 may be 32 μm. Thus, the thickness of the silicon substrate region to be removed may be about 728 μm. These values are by way of example only and each may vary in further embodiments. For example, the thickness of the finished wafer 100 may be 25 μm or thinner Where the finished wafer 100 is 25 μm, the thickness of the removed wafer portion 100b may be about 735 μm.

Figure 11:
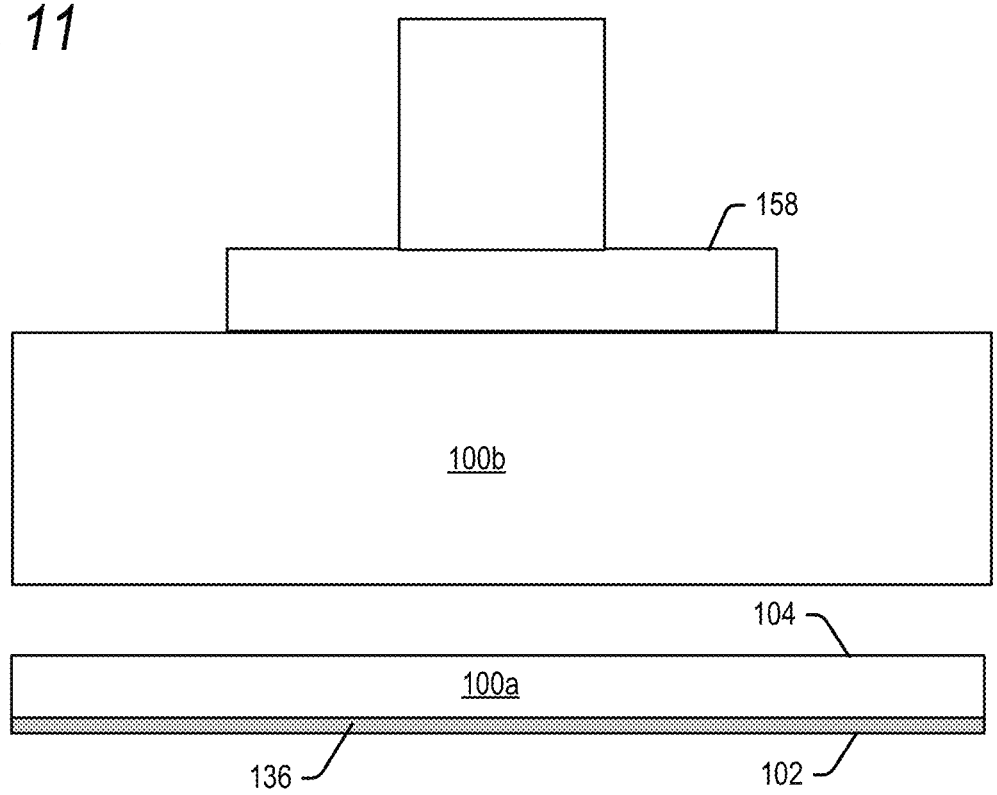
FIG. 11 is an edge view of thinned wafer and removal of a substrate layer of the wafer according to embodiments of the present technology.

FIG. 11 is an edge view showing removal of the portion 110b of wafer 100 by a vacuum chuck 158 after the stealth horizontal lasing process of step 212. A portion of the silicon substrate region 112 remains as part of the first portion 100a, which is again referred to simply as wafer 100 going forward. The portion 100b that was severed may be discarded. The new second major (back) surface 104 is the surface of substrate wafer 100 defined by removal of the portion 100b.

In embodiments, after stealth lasing step 212, the second major surface 104 may undergo a polishing step, using for example a Z3 polishing wheel rotating against the back surface. In further embodiments, the horizontal stealth lasing step 212 may leave a back surface 104 that does not require further polishing.

Figure 12:
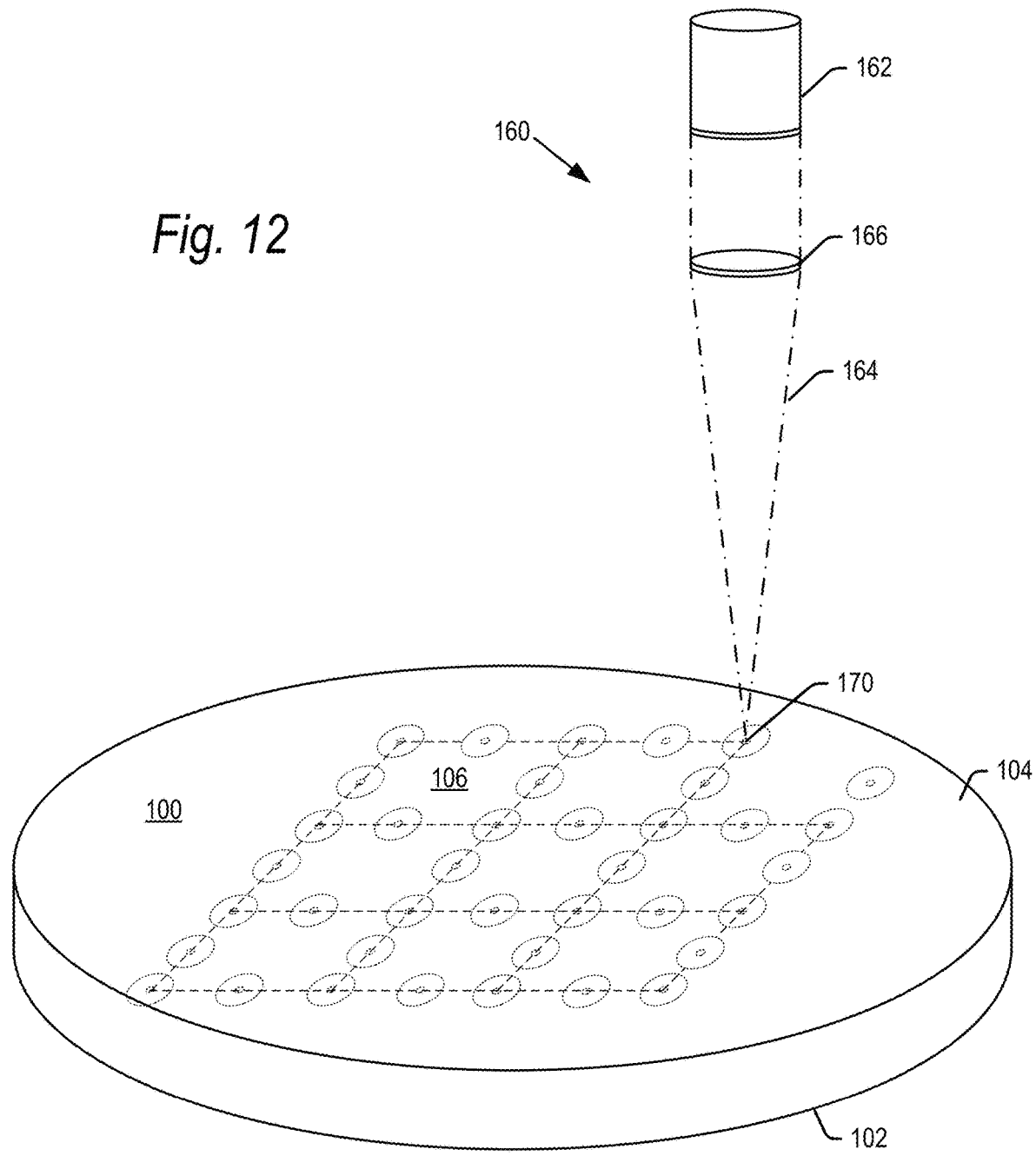
FIG. 12 is a perspective view of a vertical stealth lasing process for dicing semiconductor dies from a semiconductor wafer according to embodiments of the present technology.

Thereafter, the wafer 100 may be diced in step 214. Dicing of the wafer may be performed using a vertical stealth dicing process as illustrated in FIG. 12. The vertical stealth dicing process may use a laser assembly 160 including a laser generator 162 generating a laser beam 164, and optics 166 for focusing the laser beam 164 to a point beneath the surface of wafer 100. The vertical laser assembly 160 may form layers of voids in vertical planes (orthogonal to surfaces 102, 104) around the outline of each semiconductor die 106 in wafer 100. The vertical laser assembly 160 may be structurally and operationally identical to the horizontal laser assembly 140, and may in fact be the same laser assembly rotated from a horizontal orientation to a vertical orientation over the wafer 100. The vertical laser assembly 160 may be structurally and/or operationally different than the horizontal laser assembly 140 in further embodiments.

At least portions of the vertical laser assembly 160 are mounted for translation over the wafer 100 in the x-y plane. With the wafer 100 still supported on chuck 134 or other support surface with the taped first major surface 102 resting against the chuck, the laser assembly 160 may emit a pulsed laser beam 164 focused to a point beneath the wafer's surface 104 using the opticics 166. When the laser beam hits a peak power density at the focal point, the wafer absorbs the energy, and a pinpoint hole 170 is created beneath the wafer's surface.

The vertical laser assembly may be moved in the x-y plane in rows (along the x-axis) and columns (along the y-axis) and activated at a number of points so that a number of closely situated pinpoint holes 170 are formed at an intermediate depth of the wafer (between the first and second major surfaces 102, 104). The rows and columns of pinpoint holes 170 define the eventual shape and outline of each semiconductor die 106 to be diced from wafer 100 as indicated in FIG. 12. The laser assembly 160 may form a single layer of pinpoint holes 170, or multiple layers of vertically aligned pinpoint holes 170 at multiple depths by adjusting the vertical position of optics 166. Once the one or more layers of pinpoint holes 170 have been created, cracks will naturally propagate from the holes 170 to the first and second major surfaces 102, 104 in the [1,0,1] and [0,1,1] crystalline planes, thus effectively dicing each semiconductor die 106 from the wafer 100. While a vertical stealth dicing process has been described for dicing the wafer 100, it is understood that the wafer 100 may be diced by other technologies in further embodiments, including by dicing blade.

After completion of the horizontal stealth lasing step 212 and vertical stealth lasing step 214, a layer of die attach film (DAF) adhered to a flexible dicing tape may be applied onto the second major surface 104 of the wafer 100 in step 218. The DAF tape and dicing tape may be applied to surface 104 before the horizontal stealth lasing step 212 and/or the vertical stealth lasing step 214 in further embodiments. In step 220, the wafer may be flipped over on the support chuck with the DAF and dicing tapes facing the chuck, and the laminated tape layer 136 on the first major surface 102 may be removed. The flexible dicing tape may be stretched along orthogonal axes in step 224 to separate the individual semiconductor dies 106. Thereafter, in step 226, individual semiconductor dies 106 may be removed by a pick and place robot.

Figure 13:
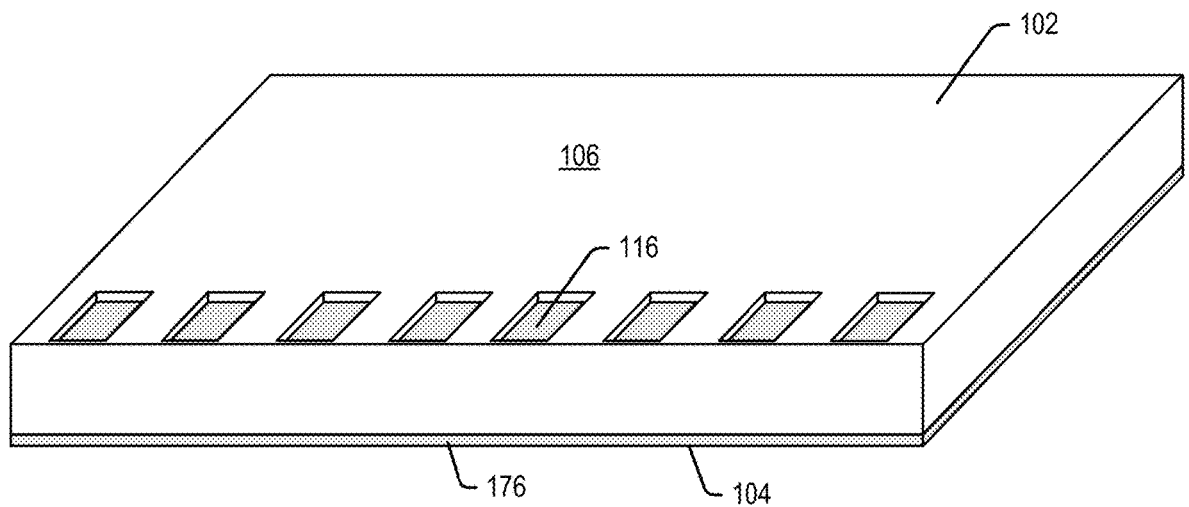
FIG. 13 is a perspective view of a die cut from a wafer thinned by a stealth lasing process according to embodiments of the present technology.

FIG. 13 shows a perspective view of a sample semiconductor die 106 which has been thinned using the horizontal stealth lasing process of the present technology. Die bond pads 116 are shown but as noted earlier, the number and position of die bond pads 116 are shown by way of example, and die 106 may include more die bond pads, in other positions, in further embodiments. The surface 104 (covered by DAF tape 176) is smooth and uniform.

Figure 14:
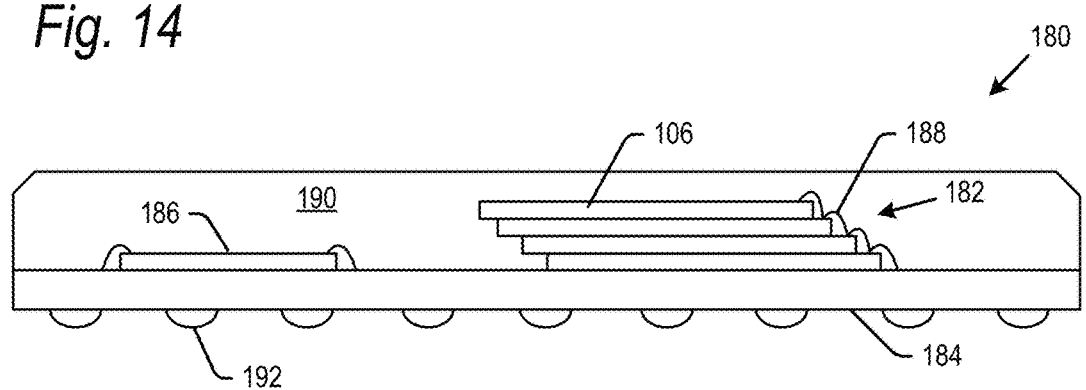
FIG. 14 is a cross-sectional side view of a semiconductor device including semiconductor dies cut from a wafer thinned by a stealth lasing process according to embodiments of the present technology.

FIG. 14 is a side view of a completed semiconductor device 180 including semiconductor dies 106 thinned using a horizontal stealth lasing process according to embodiments of the present technology. In the embodiment shown, the semiconductor device 180 includes four semiconductor dies 106 picked from wafer 100 and placed into a die stack 182 which is built on top of a substrate 184. However, the die stack 182 may include other numbers of semiconductor dies 106, including for example 2, 8, 16, 32, 64 in further embodiments. The dies are fixed within the die stack 182 and on substrate 184 using the DAF layer 176 on the bottom of each die 106. A controller die 186 may be mounted to substrate 184, which in embodiments may be an ASIC for controlling the transfer of data to/from the dies 106 in stack 182.

The dies 106 may be electrically connected to each other and the substrate 184 using bond wires 188, though the dies 106 may be electrically connected to each other and the substrate 184 by other schemes in further embodiments including for example through silicon vias (TSVs). In order to leave room for the bond wires 188 to connect to the bond pads 116 on each semiconductor die 106 in stack 182, the dies 106 are stacked in a stepped offset from each other. In the embodiment of FIG. 14, all of the dies in the stack 182 may be stepped offset in the same direction. They may be stacked in groups stepped in opposite directions in further embodiments.

The dies 106, 186 and bond wires 188 may be encapsulated in a molding compound 190, which may for example be epoxy resin, Phenol resin, fused silica, crystalline silica, carbon black and/or metal hydroxide. Other molding compounds are contemplated. In embodiments, the semiconductor device 180 may be used as a BGA (ball grid array) package soldered to a host device such as a printed circuit board. In such embodiments, the semiconductor device 180 may further include solder balls 192 on a bottom surface of the substrate 184 for physically and electrically coupling the semiconductor device 180 to the host device. In further embodiments, the semiconductor device 180 may be used as an LGA (land grid array) package configured for insertion to and removal from a slot of a host device. In such embodiments, the solder balls 192 may be replaced with contact fingers (not shown) on a bottom surface of the substrate 184 for mating with pins in the host device slot. It is understood that semiconductor device 180 may have other configurations in further embodiments.

Horizontal stealth lasing to thin the wafer 100 as described above provides several advantages. As noted above, horizontal stealth lasing may significantly decrease the fabrication times in thinning wafers, thus increasing wafer and die yields. Moreover, as noted in the Background, conventional backgrinding processes may generate cracks in semiconductor wafers, especially those that are currently made at thin, fragile thicknesses. Horizontal stealth dicing according to the present technology eliminates wafer cracking due to the backgrinding processes. Elimination of such cracks improves wafer and die yields, and does away with the need for additional screening/inspection steps. It is also known to thin a wafer using a vertical stealth lasing process. However, such processes may make the second major surface rough or uneven, which in turn can lead to weakness or cracks in the completed semiconductor dies. The horizontal stealth lasing process yields a smooth, uniform and strong second major surface 104.

Additionally, conventional backgrinding processes generate debris and foreign materials that can cause cracks and otherwise impair the assembly process. Elimination of the backgrinding process prevents the generation of this debris and foreign material, thus further improving yield and die quality. Moreover, the multiple backgrinding wheels needed for conventional wafer thinning add significant time, expense and complexity to the packaging process. Omission of the backgrinding wheels in accordance with the present technology improves each of these packaging parameters.

In summary, an example of the present technology relates to a semiconductor die, comprising: a first major surface; a plurality of integrated circuits formed in the first major surface of the wafer; a second major surface opposed to the first major surface, the second major surface defined by a plurality of laser-generated localized pinpoint holes; and a die attach film (DAF) layer covering the second major surface.

In another example, the present technology relates to a semiconductor wafer, comprising: a first major surface; a plurality of semiconductor dies, the plurality of semiconductor dies comprising integrated circuits formed in the first major surface of the wafer; and a second major surface opposed to the first major surface, the second major surface defined by a plurality of laser-generated localized pinpoint holes.

In a further example, the present technology relates to a method of forming a semiconductor die from a wafer comprising a plurality of semiconductor dies, the wafer comprising a first major planar surface, a second major planar surface and an outer edge extending between the first and second major planar surfaces, the method comprising: forming integrated circuits in the first major planar surface; thinning the wafer by application of one or more laser beams through the outer edge of the wafer; and dicing the semiconductor die from the thinned wafer.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method of separating a semiconductor die from a wafer comprising a plurality of semiconductor dies, the wafer comprising a first major planar surface, a second major planar surface and an outer edge extending between the first and second major planar surfaces, wherein each die comprises a plurality of integrated circuits formed in the first major planar surface of the wafer, the method comprising:
   rotating the wafer;
   penetrating the outer edge of the wafer with a laser beam without removing portions of the outer edge;
   pulsing the laser at distinct points at a given radial distance from a center of the wafer;
   repeating said step of pulsing the laser at distinct points at multiple other radial distances from the center of the wafer;
   thinning the wafer by allowing cracks to propagate between the distinct points at multiple radii; and
   dicing the semiconductor die from the thinned wafer.

2. The method of claim 1, wherein the wafer is supported on a chuck with the first major planar surface facing the chuck for said step of thinning the wafer.

3. The method of claim 2, wherein said chuck rotates during said step of thinning the wafer.

4. The method of claim 2, wherein a focal point of the laser is adjusted to different radial positions of the wafer as the wafer is rotating on the chuck to generate pinpoint holes at the different radial positions in a plane parallel to the first major surface.

5. The method of claim 1, wherein the step of thinning the wafer by application of one or more laser beams through the outer edge of the wafer comprises the step of generating pinpoint holes from a pair of laser assemblies in a plane parallel to the first major planar surface of the wafer.

6. The method of claim 1, wherein the step of dicing the semiconductor die from the thinned wafer comprises the step of generating pinpoint holes in a plane orthogonal to the first major planar surface of the wafer, cracks propagating between the pinpoint holes to dice the die from the wafer.

7. A method of separating a semiconductor die from a wafer comprising a plurality of semiconductor dies, the wafer comprising a first major planar surface, a second major planar surface and an outer edge extending between the first and second major planar surfaces, wherein each die comprises a plurality of integrated circuits formed in the first major planar surface of the wafer, the method comprising:
   rotating the wafer;
   pulsing a laser beam through the outer edge of the wafer as the wafer rotates to form focal points within an interior of the wafer, each focal point creating a localized pinpoint hole around a circle;
   changing one of a distance of the focal point from a laser beam generator, or a position of the laser beam generator from the wafer, to create multiple circles of localized pinpoint holes at different radii, the different radii ranging from at or adjacent a central axis of the wafer to at or adjacent the outer edge of the wafer;
   thinning the wafer by allowing cracks to propagate between the localized pinpoint holes at different radii; and
   dicing the semiconductor die from the thinned wafer.

8. The method of claim 7, wherein the wafer is supported on a chuck with the first major planar surface facing the chuck for said step of thinning the wafer.

9. The method of claim 8, wherein said chuck rotates during said step of thinning the wafer.

10. The method of claim 7, wherein the step of thinning the wafer by application of one or more laser beams through the outer edge of the wafer comprises the step of generating pinpoint holes from a pair of laser assemblies in a plane parallel to the first major planar surface of the wafer.

11. The method of claim 1, wherein the step of dicing the semiconductor die from the thinned wafer comprises the step of generating pinpoint holes in a plane orthogonal to the first major planar surface of the wafer, cracks propagating between the pinpoint holes to dice the die from the wafer.

* * * * *